(12) United States Patent
Ko et al.

(10) Patent No.: US 8,313,585 B2
(45) Date of Patent: Nov. 20, 2012

(54) SPORTS EQUIPMENT COMPRISING DIFFUSED TITANIUM NITRIDE

(76) Inventors: Philos Jongho Ko, Barrington, IL (US); Bongsub Samuel Ko, Barrington, IL (US)

(*) Notice: Subject to any disclaimer, the term of this patent is extended or adjusted under 35 U.S.C. 154(b) by 910 days.

(21) Appl. No.: 11/850,297

(22) Filed: Sep. 5, 2007

(65) Prior Publication Data

US 2008/0213619 A1    Sep. 4, 2008

Related U.S. Application Data

(60) Provisional application No. 60/824,553, filed on Sep. 5, 2006.

(51) Int. Cl.
*C23C 8/40* (2006.01)
*B32B 15/00* (2006.01)
*C25D 11/26* (2006.01)
*C25D 5/00* (2006.01)

(52) U.S. Cl. ........ 148/212; 428/660; 428/415; 205/205; 205/231; 205/322

(58) Field of Classification Search .......... 428/615, 428/627, 660, 415; 148/238, 212; 205/205, 205/231, 322

See application file for complete search history.

(56) References Cited

U.S. PATENT DOCUMENTS

| | | | | |
|---|---|---|---|---|
| 3,242,664 A * | 3/1966 | Lederrey | ........ | 368/281 |
| 5,812,500 A * | 9/1998 | Webb, Jr. | ........ | 368/282 |
| 5,885,375 A * | 3/1999 | Takemura et al. | ........ | 148/421 |
| 7,732,014 B2 * | 6/2010 | Ko et al. | ........ | 427/255.394 |
| 2003/0049386 A1 * | 3/2003 | Ko | ........ | 427/430.1 |

* cited by examiner

*Primary Examiner* — Jessee R. Roe
(74) *Attorney, Agent, or Firm* — Eugene M. Cummings, P.C.

(57) ABSTRACT

A method for diffusing titanium and nitride into a sports equipment component. The method generally includes the steps of providing a sports equipment component providing a salt bath which includes sodium dioxide and a salt selected from the group consisting of sodium cyanate and potassium cyanate; dispersing metallic titanium formed by electrolysis of a titanium compound in the bath, heating the salt bath to a temperature ranging from about 430° C. to about 670° C.; and soaking the sports equipment component in the salt bath for a time of from about 10 minutes to about 24 hours. In accordance with another aspect of the present invention, the sports equipment component may further be treated with conventional surface treatments or coatings.

11 Claims, No Drawings

SPORTS EQUIPMENT COMPRISING DIFFUSED TITANIUM NITRIDE

RELATED APPLICATION

This application claims benefit under 35 U.S.C. §119(e) of U.S. Provisional Application Ser. No. 60/824,553, entitled "Sports Equipment Comprising Diffused Titanium Nitride," filed Sep. 5, 2006 naming Philos Jongho Ko and Bongsub Samuel Ko as inventors, the complete disclosure thereof being incorporated by reference.

BACKGROUND OF THE INVENTION

The present invention generally relates to a process for diffusing titanium and nitride into sports equipment. More specifically, a process is provided for diffusing titanium and nitride into at least a portion of sports equipment (e.g., the components of golf club or a tennis racquet) in the presence of electrolyzed titanium.

A low temperature process is preferred in that it prevents or lessens warping and twisting of the material, two disadvantages of conventional surface treatment processes. Titanium is considered a generally inert, light-weight material which has very high tensile strength (or toughness) and excellent corrosion resistance. Various materials have been used in the manufacture of sports equipment such as golf clubs, divet tools, tennis racquets, bicycles, bicycle gears, baseball bats, archery, skates, ski equipment and the like. Such materials include, but are not limited to, steel and steel alloys (e.g., carbon steel), aluminum and aluminum alloys (e.g., aluminum-titanium alloys), titanium and titanium alloys, and copper and copper alloys (e.g., copper-beryllium, copper-tin, copper-nickel-zinc).

In an effort to increase the hardness, toughness, strength, and wear resistance of the equipment, sports equipment have been surface treated. Examples of methods for treating sports equipment include electroplating, heat treatment, or nitriding processes. However, these processes are deficient in many respects, especially when being applied to sports equipment.

These processes are generally susceptible to chipping of the protective layer. Moreover, sports equipment (e.g., golf clubs, cycling or ski components), require their components to be as lightweight as possible. For example, for golf clubs, it is desired to balance the feel of the club with various resistive properties such as toughness, hardness, corrosion resistance, and wear resistance. Although they may increase the resistive properties, traditional surface treatments increase the weight of the equipment. For competitive purposes, any increase in weight, which may be a matter of grams, may dramatically impede the performance of the athlete.

Through the adding of layers, traditional processes further change the dimensions of equipment. Sports equipment (e.g., golf club heads or cycling components) are often designed in order to provide for an optimal structure, wherein any angular and/or dimensional change would greatly impede performance of that equipment (e.g., aerodynamics).

Therefore, an object of the present invention to diffuse the lightweight material, titanium and nitride, into sporting equipment without causing any dimensional change thereto. It is further an object of the present invention to provide a process for strengthening the adhesion between a sports equipment component of sports equipment with a protective layer formed by conventional surface treatments or coatings.

SUMMARY OF THE INVENTION

In view of the desired goals of the invention claimed herein, a method for diffusing titanium and nitride into a sports equipment component is provided. As such, the present invention process allows for the implementation of the enhanced properties of titanium in such a sports equipment component.

The method generally includes the steps of providing a sports equipment component having a microstructure including a plurality of voids; providing a salt bath which includes sodium dioxide and a salt selected from the group consisting of sodium cyanate and potassium cyanate; dispersing metallic titanium formed by electrolysis of a titanium compound in the bath; heating the salt bath to a temperature ranging from about 430° C. to about 670° C.; and soaking at least a portion of the sports equipment component in the salt bath for a time of from about 10 minutes to about 24 hours such that the electrolyzed titanium disperses within the voids of the sports equipment microstructure.

In accordance with another aspect of the present invention, the sports equipment component may be treated with conventional surface treatments or coatings. In one such embodiment, the sports equipment component may be treated using the present invention titanium and nitride diffusion process and then treated with a conventional surface treatment or coating. In yet another embodiment, the sports equipment component may be treated with a conventional surface treatment or coating and then treated using the present invention titanium and nitride diffusion process. In accordance with this embodiment, titanium and nitrogen diffuses and fills the voids of the protective layer, while also diffusing and filling in the voids among the grains of the sports equipment component structure. In this way, the diffusion from the protective layer en route to the underlying sports equipment component forms a resulting titanium interface or network therebetween. This interface or network provides for the added benefit of providing better adhesion between the protective layer and the underlying sports equipment component.

In accordance with yet another aspect of the invention, further provided is a treated article comprising a sports equipment component having a microstructure including a plurality of voids; a titanium component diffused into said plurality of voids of said microstructure; and said titanium component in addition to any titanium present in the sports equipment component.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

DETAILED DESCRIPTION OF THE MULTIPLE EMBODIMENTS

While the invention is susceptible of embodiment in many different forms and in various combinations, particular focus will be on the multiple embodiments of the invention described herein with the understanding that such embodiments are to be considered exemplifications of the principles of the invention and are not intended to limit the broad aspect of the invention. For example, the present invention is directed to any sports equipment including but not limited to golf equipment (e.g., golf clubs, golf club heads, divet tools, and golf carts), tennis equipment (e.g., racquets), cycling equipment (e.g., bicycle frames, bicycle gears), baseball equipment (e.g., baseball bats), archery equipment, skating equipment (e.g., skateboards, rollerskates, inline skates, ice skates, wheels for such, bearings for such, gears for such), ski equipment (e.g., skis, ski poles) and the like.

Although other suitable materials are contemplated, the sports equipment component may be a metal sports equipment component or materials having a compact, granular microstructure. Such materials generally have a microstructure with a plurality of voids. These voids contribute to the brittleness and the (lack of) tensile strength of the material as a whole. Accordingly, for sports equipment, it is desirable to diffuse a resilient and elastic material into these voids in order to increase the tensile strength of the material.

In one embodiment of the present invention, a moderately heated non-electrolyzed salt bath is used which contains activated-electrolyzed metallic titanium. Sodium dioxide and a salt selected from the group consisting of sodium cyanate and potassium cyanate is present in the salt bath. Additionally, up to about 20 w/w % of $NaCO_2$ or sodium chloride may further be added. To the bath is added from about 2 to about 20 micrograms of electrolyzed metallic titanium. At least a portion of the sports equipment component is soaked in the bath for from about 10 minutes to 24 hours at from about 430° C. to about 670° C. The electrolyzed titanium catalyzes the diffusion of the titanium and nitride from the bath into about 20 to about 100 microns of the sports equipment component, filling the voids within the microstructure of the component. Areas in which the sports equipment component is not desired to be treated may alternatively be sealed using a non-diffusable material placed on the surface corresponding to that area.

Through this process, titanium and nitride are diffused into the sports equipment component. Accordingly, resistive properties such as toughness, hardness, corrosion resistance, and wear resistance are enhanced while a minimal weight or dimensional change is incurred.

Expensive alloys (e.g., copper-beryllium, copper-tin, copper-nickel-zinc) have traditionally been used to achieve lightweight equipment (especially, golf and cycling equipment) which has enhanced resistive properties. Moreover, it is shown that a cheaper lightweight aluminum sports equipment treated with the present invention process outperforms sports equipment comprising only the expensive alloys because the expensive alloys still include a plurality of voids within their microstructures.

EXAMPLE 1

In one example, steel golf club heads for fairway woods were treated. A moderately heated non-electrolyzed salt bath was used which contains activated-electrolyzed metallic titanium. Sodium dioxide and a salt selected from the group consisting of sodium cyanate and potassium cyanate was present in the salt bath. Additionally, up to about 20 w/w % of $NaCO_2$ or sodium chloride was added. To the bath was added from about 2 to about 20 micrograms of electrolyzed metallic titanium. At least a portion of each golf club head was soaked in the bath for from about 10 minutes to 24 hours at from about 430° C. to about 670° C. The electrolyzed titanium catalyzed the diffusion of the titanium and nitride from the bath into about 20 to about 100 microns of the golf club head, filling the voids within the microstructure of the component.

In a test, each treated golf club head was compared to a similar untreated golf club head (e.g., each club had the same shafts and grips). At the same swing-weights and using the same tee-boxes and balls, the treated golf club heads outperformed at a driving distance of about 10 meters to about 20 meters.

EXAMPLE 2

In another example, soft iron (e.g., S45C, S15C) golf club heads were treated. A moderately heated non-electrolyzed salt bath was used which contains activated-electrolyzed metallic titanium. Sodium dioxide and a salt selected from the group consisting of sodium cyanate and potassium cyanate was present in the salt bath. Additionally, up to about 20 w/w % of $NaCO_2$ or sodium chloride was added. To the bath was added from about 2 to about 20 micrograms of electrolyzed metallic titanium. At least a portion of each golf club head was soaked in the bath for from about 10 minutes to 24 hours at from about 430° C. to about 670° C. The electrolyzed titanium catalyzed the diffusion of the titanium and nitride from the bath into about 20 to about 100 microns of the golf club head, filling the voids within the microstructure of the component.

In a test, each treated golf club head was compared to a similar untreated golf club head (e.g., each club had the same shafts and grips). At the same swing-weights and using the same tee-boxes and balls, the treated golf club heads outperformed at a driving distance of about 10 meters to about 20 meters.

EXAMPLE 3

In another example, the face for a golf club head for fairway wood may be treated. A moderately heated non-electrolyzed salt bath may be used which contains activated-electrolyzed metallic titanium. Sodium dioxide and a salt selected from the group consisting of sodium cyanate and potassium cyanate may be present in the salt bath. Additionally, up to about 20 w/w % of $NaCO_2$ or sodium chloride may be added. To the bath may be added from about 2 to about 20 micrograms of electrolyzed metallic titanium. The face of the golf club head may be soaked in the bath for from about 10 minutes to 24 hours at from about 430° C. to about 670° C. The electrolyzed titanium will catalyze the diffusion of the titanium and nitride from the bath into about 20 to about 100 microns of the face of the golf club head, filling the voids within the microstructure of the component. The face may be positioned back onto the golf club head.

It is generally expected that treating only the face (the impact area of the golf club head) would optimize the performance of the club. This requires less material, and therefore weight, than treating the entire golf club head. The titanium diffused within the voids of the microstructure of the face of the gold club head will provide extra elasticity and resiliency of the material. Accordingly, any impact therefrom would cause the ball to travel further. By only treating the face, the weight distribution of the various portions of the golf club head would also not be altered from the original golf club head.

In another embodiment, the golf club head may be soaked wherein only the face is exposed to the bath. For example, areas in which the golf club head is not desired to be treated may alternatively be sealed using a non-diffusable material placed on the surface corresponding to that area. In this way, only the sweet spots of golf club head may be treated and exposed to the bath, thereby requiring less material and weight than treating the entire face or golf club head.

In yet other embodiments, the process may be controlled in order to affect the feel of the golf club. For example, the temperature of the bath and time in which the golf club head is soaked in the bath may be adjusted in order to allow for more titanium and nitride to diffuse therein. Adjusting these parameters will accommodate the "feel" of the golf club head desired by the golfer. It has further been shown that the diffused titanium, due to its tough, resilient nature provides for longer drives.

EXAMPLE 4

In yet another example, a frame for a tennis racquet may be treated. A moderately heated non-electrolyzed salt bath may be used which contains activated-electrolyzed metallic titanium. Sodium dioxide and a salt selected from the group consisting of sodium cyanate and potassium cyanate may be present in the salt bath. Additionally, up to about 20 w/w % of $NaCO_2$ or sodium chloride was added. To the bath may be added from about 2 to about 20 micrograms of electrolyzed metallic titanium. At least a portion of the frame may be soaked in the bath for from about 10 minutes to 24 hours at from about 430° C. to about 670° C. The electrolyzed titanium will catalyze the diffusion of the titanium and nitride from the bath into about 20 to about 100 microns of the frame, filling the voids within the microstructure of the component.

In accordance with another aspect of the present invention, a portion of the sports equipment component may be treated with conventional surface treatments or coatings. In one such embodiment, a portion of the sports equipment component may be treated using the present invention titanium and nitride diffusion process and then treated with a conventional surface treatment or coating. In yet another embodiment, a portion of the sports equipment component may be treated with a conventional surface treatment or coating and then treated using the present invention titanium and nitride diffusion process.

Any conventional process for treating or coating materials may be used in these embodiments. For example, the conventional processes may include, but are not limited to, electroplating, heat treatment, nanocoating, ceramic coating, Physical Vapor Deposition (PVD), Chemical Vapor Deposition (CVD), Ion Assisted Coating (IAC), and other surface treatments or coating suitable for materials or metals. As explained in detail above, conventional surface treatments and coatings, when used alone, are generally deficient for sports equipment applications (e.g., due to dimensional change, increased weight, chipping).

The protective layer formed by these conventional processes generally has a weak adhesion with the sports equipment component surface, thereby causing it to be susceptible to chipping. Moreover, these conventional treatments do not strengthen or increase the tensile properties of the underlying sports equipment components itself. In an embodiment of the present invention, a sports equipment component having a protective layer thereon may be subjected to the present invention process as follows.

At least a portion of the sports equipment component having a protective layer thereon is soaked in a moderately heated non-electrolyzed salt bath which contains activated-electrolyzed metallic titanium. Sodium dioxide and a salt selected from the group consisting of sodium cyanate and potassium cyanate is present in the salt bath. Additionally, up to about 20 w/w % of $NaCO_2$ or sodium chloride may further be added. To the bath is added from about 2 to about 20 micrograms of electrolyzed metallic titanium. At least a portion of the sports equipment component having a protective layer thereon is soaked in the bath for from about 10 minutes to 24 hours at from about 430° C. to about 670° C. The electrolyzed titanium catalyzes the diffusion of the titanium and nitride from the bath into both the portion of the sports equipment component and the protective layer thereon.

In accordance with this embodiment of the present invention process, titanium and nitrogen diffuses and fills the voids of the protective layer, while also diffusing and filling in the voids of the portion of the sports equipment component. In this way, the diffusion from the protective layer en route to the portion of the underlying sports equipment component forms a resulting titanium interface or network therebetween. This interface or network provides for the added benefit of providing better adhesion between the protective layer and the underlying portion of the sports equipment component. Accordingly, titanium and nitride surprisingly diffuses into not only the sports equipment component, but also the protective layer thereon, using the process of the present invention. It is important to note that an additional layer is not formed on the protective layer. Therefore, there is no dimensional change in the sports equipment component.

EXAMPLE 5

A golf club head is treated with a Chemical Vapor Deposition (CVD) process and prior to having titanium and nitride diffused therethrough in accordance with an aspect of the present invention. As discussed above, conventional nitriding surface treatments are deficient coatings or surface treatments. The protective layer formed by these conventional processes, such as a CVD process, generally has a weak adhesion with the golf club head, thereby causing it to be susceptible to chipping. Moreover, these conventional treatments do not strengthen or increase the tensile properties of the golf club head itself.

The golf club head having a protected layer thereon may be subjected to the present invention process as follows. The golf club head containing a metal or metal alloy having a protective layer thereon is soaked in a moderately heated non-electrolyzed salt bath which contains activated-electrolyzed metallic titanium. Sodium dioxide and a salt selected from the group consisting of sodium cyanate and potassium cyanate is present in the salt bath. Additionally, up to about 20 w/w % of $NaCO_2$ or sodium chloride may further be added. To the bath is added from about 2 to about 20 micrograms of electrolyzed metallic titanium. The golf club head having a protective layer thereon is soaked in the bath for from about 10 minutes to 24 hours at from about 430° C. to about 670° C. The electrolyzed titanium catalyzes the diffusion of the titanium and nitride from the bath into both the golf club head and the protective layer thereon.

Accordingly, titanium and nitrogen diffuses and fills the voids of the protective layer, while also diffusing and filling in the voids among the grains of the metal structure of the golf club head. In this way, the diffusion from the protective layer en route to the underlying golf club head forms a resulting titanium interface or network therebetween. This interface or network provides for the added benefit of providing better adhesion between the protective layer and the underlying golf club head.

EXAMPLE 6

The frame of a tennis racquet is treated with a Chemical Vapor Deposition (CVD) process and prior to having titanium and nitride diffused therethrough in accordance with an aspect of the present invention. As discussed above, conventional nitriding surface treatments are deficient coatings or surface treatments. The protective layer formed by these conventional processes, such as a CVD process, generally has a weak adhesion with the frame, thereby causing it to be susceptible to chipping especially upon accidental impact with the tennis court. Moreover, these conventional treatments do not strengthen or increase the tensile properties of the frame itself.

The frame having a protected layer thereon may be subjected to the present invention process as follows. The frame containing a metal or metal alloy having a protective layer thereon is soaked in a moderately heated non-electrolyzed salt bath which contains activated-electrolyzed metallic titanium. Sodium dioxide and a salt selected from the group consisting of sodium cyanate and potassium cyanate is present in the salt bath. Additionally, up to about 20 w/w % of $NaCO_2$ or sodium chloride may further be added. To the bath is added from about 2 to about 20 micrograms of electrolyzed metallic titanium. The frame having a protective layer thereon is soaked in the bath for from about 10 minutes to 24 hours at from about 430° C. to about 670° C. The electrolyzed titanium catalyzes the diffusion of the titanium and nitride from the bath into both the frame and the protective layer thereon.

Accordingly, titanium and nitrogen diffuses and fills the voids of the protective layer, while also diffusing and filling in the voids among the grains of the metal structure of the frame. In this way, the diffusion from the protective layer en route to the underlying frame forms a resulting titanium interface or network therebetween. This interface or network provides for the added benefit of providing better adhesion between the protective layer and the frame.

Although golf clubs and tennis racquets are described explicitly in the examples provided herein, the process may further be applied to other sports equipment. For example, the barrel wherein a baseball bat generally impacts a baseball may be treated in order to increase the travel of a ball upon impact. In another example, the blade of an ice skate may be treated in order to increase the toughness and resiliency thereof.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

The invention claimed is:

1. A method for diffusing titanium and nitride into a sports equipment component comprising:
   providing a portion of a sports equipment component having a surface and a microstructure including a plurality of voids, wherein said sports equipment component is a portion of a golf club head;
   providing a salt bath which includes sodium dioxide and a salt selected from the group consisting of sodium cyanate and potassium cyanate;
   dispersing metallic titanium formed by electrolysis of a titanium compound, in said bath;
   heating the salt bath to a temperature ranging from about 430° C. to about 670° C.; and
   soaking the portion of the sports equipment in the salt bath for a time of from about 10 minutes to about 24 hours such that the electrolyzed titanium diffuses into the microstructure and fills at least some of the plurality of voids therein.

2. The method of claim 1 further comprising treating the sports equipment component before soaking the material in the salt bath.

3. The method of claim 2 wherein the sports equipment component is treated using nanocoating.

4. The method of claim 1 further comprising treating the sports equipment component after soaking the material in the salt bath.

5. The method of claim 4 wherein the sports equipment component is treated using nanocoating.

6. The method of claim 1 wherein the sports equipment component contains a carbide alloy.

7. The method of claim 1 wherein the sports equipment component is a metal sports equipment component.

8. The method of claim 7 wherein the sports equipment component comprises a titanium alloy.

9. The method of claim 1 wherein the sports equipment component is golf equipment.

10. The method of claim 1 wherein the golf club head includes a face and the portion of the golf club head is the face of the golf club head.

11. A method of increasing the elasticity and resiliency of sports equipment by diffusing titanium and nitride therein, comprising:
    providing a portion of a sports equipment component having a surface and a microstructure including a plurality of voids, wherein said sports equipment component is a portion of a golf club head;
    providing a salt bath which includes sodium dioxide and a salt selected from the group consisting of sodium cyanate and potassium cyanate;
    dispersing metallic titanium formed by electrolysis of a titanium compound, in said bath;
    heating the salt bath to a temperature ranging from about 430° C. to about 670° C.; and
    soaking the portion of the sports equipment in the salt bath for a time of from about 10 minutes to about 24 hours such that the electrolyzed titanium diffuses into the microstructure and fills at least some of the plurality of voids therein.

* * * * *